(12) United States Patent
Günther et al.

(10) Patent No.: US 6,599,687 B1
(45) Date of Patent: Jul. 29, 2003

(54) PROCESS FOR PRODUCING STRUCTURED PROTECTIVE AND INSULATING LAYERS

(75) Inventors: Ewald Günther, Chempaka Court (SG); Recai Sezi, Röttenbach (DE); Michael Keitmann, Weisendorf (DE)

(73) Assignee: Osram Opto Semiconductor GmbH Co. OHG, Regensburg (DE)

( * ) Notice: Subject to any disclaimer, the term of this patent is extended or adjusted under 35 U.S.C. 154(b) by 0 days.

(21) Appl. No.: 09/156,441

(22) Filed: Sep. 18, 1998

(30) Foreign Application Priority Data

Sep. 18, 1997 (DE) .......................... 197 41 230

(51) Int. Cl.$^7$ .............................. G03C 5/00; G21G 5/00
(52) U.S. Cl. ................... 430/394; 430/328; 430/313; 430/322; 430/966; 430/296; 430/942; 250/492.3
(58) Field of Search ................. 430/394, 328, 430/313, 322, 966, 296, 942; 250/492.3

(56) References Cited

U.S. PATENT DOCUMENTS

| | | | | | |
|---|---|---|---|---|---|
| 4,543,225 A | * | 9/1985 | Beaujean | ................... | 264/167 |
| 4,775,609 A | * | 10/1988 | McFarland | .................. | 430/325 |
| 4,931,380 A | * | 6/1990 | Owens et al. | ............... | 430/296 |
| 5,081,000 A | * | 1/1992 | Kuehn et al. | ............... | 430/281 |
| 5,300,403 A | * | 4/1994 | Angelopolus et al. | ...... | 430/325 |

OTHER PUBLICATIONS

H. Hiraoka et al.: "UV hardening of photo–and electron beam resist patterns", J. Vac. Sci. Technol., 19(4), Nov./Dec. 1981, pp. 1132–1135.

* cited by examiner

*Primary Examiner*—Wayne A. Langel
*Assistant Examiner*—Jonas N. Strickland
(74) *Attorney, Agent, or Firm*—Laurence A. Greenberg; Werner H. Stemer; Ralph E. Locher

(57) ABSTRACT

A process for producing structured or patterned protective and insulating layers includes applying a solution of a photosensitive polyhydroxyamide or polyhydroxyimide to a substrate and drying. The layer is patterned or structured by irradiation with UV light or X-rays through the use of a mask or by guidance of a UV or electron beam and by subsequent aqueous-alkali development. The patterned or structured layer is irradiated over the whole area with UV light and then tempered or heat-treated.

6 Claims, No Drawings

PROCESS FOR PRODUCING STRUCTURED PROTECTIVE AND INSULATING LAYERS

BACKGROUND OF THE INVENTION

Field of the Invention

The invention relates to a process for producing patterned or structured protective and insulating layers.

In order to protect microelectronic and optoelectronic components against external influences, such as moisture, the components are initially provided with a patterned or structured buffer layer ("buffer coating") and then with a molding or potting compound. Due to distinct cost advantages during patterning or structuring, photosensitive materials are preferred to non-photosensitive materials in the fabrication of the buffer layers. In particular, in the case of optoelectronic components, sufficient transparency of the buffer layer (as well as of the potting compound) is very important. However, even in microelectronic components, which do not require a transparent molding compound, good transparency of the buffer layer is important because a marking which is applied in order to distinguish between good and bad chips is easier to identify given a transparent material.

Polyimides, which are fabricated by heat-treating or tempering photosensitive polyimide precursors, have been used heretofore as a material for buffer layers (see the book entitled "Polymers in Microelectronics—Fundamentals and Applications", by D. S. Soane and Z. Martynenko, Elsevier, Science Publishers B. V., Amsterdam 1989, pages 1 to 13). However, polyimides of that type do not have a sufficient transparency (after the heat-treatment). Moreover, for patterning or structuring of the precursors, it is necessary to work according to the negative mode and the development must be effected by using organic solvents.

SUMMARY OF THE INVENTION

It is accordingly an object of the invention to provide a process for producing patterned or structured protective and insulating layers, which overcomes the hereinafore-mentioned disadvantages of the heretofore-known processes of this general type and which permits the production of structured protective and insulating layers, in particular buffer layers, that have above all a high transparency, in addition to a high resolution and a low absorption of moisture.

With the foregoing and other objects in view there is provided, in accordance with the invention, a process for producing or fabricating structured or patterned protective and insulating layers, which comprises applying a solution of a photosensitive polyhydroxyamide or polyhydroxyimide to a substrate, which is a wafer, in particular, and drying to form a layer; structuring or patterning the layer by irradiation with UV light or X-rays using a mask or guidance of a UV or electron beam and subsequent aqueous-alkali development; and whole-area irradiating the structured or patterned layer with UV light and then tempering or heat-treating.

The process according to the invention, which serves in particular for the fabrication of buffer layers, furnishes layers including polybenzoxazole (PBO) or polyhydroxyimide. Photosensitive PBO precursors are used, namely photosensitive polyhydroxyamides, in order to fabricate layers of polybenzoxazole. These PBO precursors are photopatterned, for example through the use of a mask, and heat-treated or tempered, with cyclization to form the polybenzoxazole being effected.

What is essential in the process according to the invention is the fact that the heat-treatment is preceded by whole-area irradiation, so-called flood exposure, that is to say irradiation without a mask. The effect which is surprisingly achieved thereby is that the polymers obtained after the heat-treatment have high transparency. In comparison with polyimides, these polymers, which have high temperature stability, afford the further advantage of permitting the precursors to be patterned or structured according to the positive mode and to be developed in an aqueous-alkaline manner. Moreover, the absorption of moisture is lower in the case of polybenzoxazole.

The following measures have proved to be advantageous in the production of the structured or patterned protective and insulating layers according to the invention.

In accordance with another mode of the invention, the whole-area irradiation is carried out with a higher radiation dose than the patterning or structuring irradiation.

In accordance with a further mode of the invention, the UV light is used for the patterning or structuring irradiation and for the whole-area irradiation, in particular UV light having a wavelength $\lambda > 200$ nm.

In accordance with an added mode of the invention, the patterning or structuring irradiation with UV light, for example using a laser, is carried out with a radiation dose of 200 to 2000 $mJ/cm^2$.

In accordance with a concomitant mode of the invention, the heat-treatment or tempering is effected at a temperature $T \geq 250°$ C.

The radiation dose is preferably 1 to 100 $mJ/cm^2$ in the event of irradiation with X-rays, and preferably 10 to 1000 $\mu C/cm^2$ in the event of irradiation with electron beams.

Other features which are considered as characteristic for the invention are set forth in the appended claims.

Although the invention is illustrated and described herein as embodied in a process for producing patterned or structured protective and insulating layers, it is nevertheless not intended to be limited to the details shown, since various modifications and structural changes may be made therein without departing from the spirit of the invention and within the scope and range of equivalents of the claims.

The construction and process for operation of the invention, however, together with additional objects and advantages thereof will be best understood from the following description of specific embodiments when read in connection with the accompanying examples.

EXAMPLE 1

Transmission Comparison of Polybenzoxazole and Polyimide

Three photosensitive solutions are used for the investigations:

(1) A commercially available photosensitive PBO solution (CRC 8200, of the firm Sumitomo) based on polyhydroxyamide, which is used directly, that is to say unchanged.

(2) A photosensitive PBO solution based on polyhydroxyamide, which contains 8 g of a PBO precursor and 2 g of a diester of bisphenol A and (naphthoquinone diazide)-5-sulphonic acid in 30 ml N-methylpyrrolidone. The PBO precursor was prepared in accordance with Published European Patent Application 0 761 718 A2 (example 5). The photosensitive solution can also be prepared in accordance with the process described in European Patent 0 264 678 B1.

(3) A commercially available photosensitive polyimide solution (PI 7510, of the firm Olin), which is used unchanged.

Coating of Quartz Wafers

Quartz wafers are cleaned in N-methylpyrrolidone and acetone and baked for 15 min on a heating plate at 160° C. The photosensitive solutions are applied to the quartz wafer through the use of a syringe through a 0.2 μm filter and spin-coated to form films. These films are then dried for 60 s at 90° C. and for 240 s at 120° C.

Exposure of the Quartz Wafers

Three quartz wafers, coated differently using the solutions (1) to (3), are exposed together in an exposure apparatus (MA4, of the firm Süss) through the use of UV light having a wavelength of 250 to 450 nm without a mask (flood exposure); exposure dose: 600 mJ/cm$^2$.

Heat-treatment of the Quartz Wafers

The exposed quartz wafers are heat-treated under nitrogen in a laboratory oven (Sirius Junior, of the firm LP-Thermtech). The heat-treatment program is identical for all of the wafers to be investigated and is set to a temperature of 350° C. (duration: 1 h). The heating-up and cooling-down rates are each 5 K/min. The polymer layers obtained have a layer thickness of 6 μm.

Transmission Investigation of the Polymer Layers

The investigations are carried out UV-spectroscopically using a UV/VIS device (UV 260, of the firm Shimadzu): the start wavelength is 350 nm and the end wavelength is 650 nm. In this case, the transmission of the polymer layers is determined as a function of the wavelength.

The following results are obtained for the transmission of the exposed layers after the heat-treatment:

|  | Polymer from solution | | |
| --- | --- | --- | --- |
| Wavelength | (1) | (2) | (3) |
| 400 nm | 82% | 82% | 12% |
| 450 nm | 88% | 88% | 33% |
| 500 nm | 90% | 90% | 50% |
| 550 nm | 96% | 96% | 61% |

The transmission of the quartz wafers coated with polybenzoxazole is ≧90% from a wavelength of 500 nm upward. Thus, layers (1) and (2) are highly transparent.

With regard to the transmission of the unexposed layers after the heat-treatment, the following is obtained:

In the case of the polymer from solution (3), the transmission is the same as that of the exposed material.

The transmission of polymers from solutions (1) and (2) is lower than in the case of the polymer from solution (3) at all of the wavelengths specified above.

Results which correspond to those in the case of the PBO solutions (1) and (2), to be precise both in the case of exposed layers and in the case of unexposed layers, are obtained when a solution of a photosensitive polyhydroxyimide, for example according to U.S. Pat. No. 4,927,736, is used.

EXAMPLE 2

2 ml of the photosensitive PBO solution (1) (see example 1) are applied to a 3" silicon wafer (with (100) orientation), without further pretreatment. Excess material is hurled off in a two-stage process (10 s at 500 revolutions per minute and 30 s at 3000 revolutions per minute) using a spincoater (of the firm Convac), and a homogeneous layer is produced. This layer is dried on a heating plate for 60 s at 90° C. and for 240 s at 120° C. The average layer thickness is then 6.5 μm. The layer is subsequently exposed polychromatically using a contact exposure apparatus (MA4, of the firm Süss) with UV light having a dose of 300 mJ/cm$^2$. Patterning or structuring is effected in this case by using a customary glass/chromium lithography mask. The layer is then developed with an aqueous-alkali developer (NMD-W 2.38%, of the firm Tokyo Oka, diluted in a ratio of 1:1 with water) on a spinner. In this case, 20 ml of developer solution are poured on with the wafer not rotating and are allowed to act for 40 s. Then hurling-off is effected for 5 s at 3000 revolutions per minute. This procedure is repeated once. The wafer is subsequently allowed to rotate for 30 s at 3000 revolutions per minute, with thorough rinsing with water being carried out during the first 15 s. The exposed regions are then removed (positive system).

Exposure without a lithography mask is subsequently effected, by using the same contact exposure apparatus. The exposure dose in this case is 600 mJ/cm$^2$. The resulting layer having an average layer thickness of 6.2 μm is then heat-treated in a laboratory oven (Sirius Junior, of the firm LP Thermtech), with the PBO precursor being cyclized to form the polybenzoxazole. Beginning at 100° C., heating to 150° C. is carried out linearly over 10 min. This temperature is kept constant for 30 min. Then heating to 350° C. is carried out, again linearly, over 35 min and this temperature is kept constant for 60 min. Subsequently, cooling down to 100° C. is carried out linearly over 45 min. The layer obtained in the process has an average thickness of 4.7 μm. It exhibits the excellent mechanical properties of PBO and, in addition, is even optically transparent.

EXAMPLE 3

5 ml of the photosensitive PBO solution (1) (see example 1) are applied to a finished processed wafer having GaN light-emitting diodes, without further pretreatment, through a syringe filter with a pore size of 1 μm. Excess material is hurled off in a two-stage process (10 s at 500 revolutions per minute and 30 s at 2200 revolutions per minute) using a spincoater (of the firm Convac), and a homogeneous layer is produced. This layer is dried on a heating plate for 60 s at 90° C. and for 240 s at 120° C. The average layer thickness is then 8.4 μm. The layer is subsequently exposed polychromatically using a contact exposure apparatus (MA4, of the firm Süss) with UV light having a dose of 450 mJ/cm$^2$. Patterning or structuring in this case is effected by using a customary glass/chromium-lithography mask. The openings in the mask are aligned above the contact areas of the diodes. The layer is then developed with an aqueous-alkali developer (NMD-W 2.38%, of the firm Tokyo Oka, diluted in a ratio of 1:1 with water) on a spinner. In this case, 20 ml of developer solution are poured on with the wafer not rotating and are allowed to act for 40 s, and then hurling-off is effected for 5 s at 3000 revolutions per minute. This procedure is repeated once. The wafer is subsequently allowed to rotate for 30 s at 3000 revolutions per minute, with thorough rinsing with water being carried out during the first 15 s.

Exposure without a lithography mask is subsequently effected, by using the same contact exposure apparatus. The exposure dose in this case is 600 mJ/cm$^2$. The resulting layer having an average layer thickness of 8.1 μm is then heat-treated in a laboratory oven (Sirius Junior, of the firm LP Thermtech), with the PBO precursor being cyclized to form the polybenzoxazole. Beginning at 100° C., heating to 150°

C. is carried out linearly over 10 min and this temperature is kept constant for 30 min. Then, heating to 350° C. is carried out, again linearly, over 35 min and this temperature is kept constant for 60 min. Subsequently, cooling down to a 100° C. is carried out linearly over 45 min. The layer obtained in the process has an average thickness of 6.1 μm. It exhibits the excellent mechanical properties of PBO and, in addition, is even optically transparent.

We claim:

1. A process for producing structured protective and insulating layers having high transparency, including the steps of:

applying a solution of a photosensitive polyhydroxyamide to a substrate and drying to form a layer;

structuring the layer by irradiation with UV light or X-rays using a mask or guidance of a UV or electron beam and subsequent aqueous-alkali development resulting in a structured layer;

causing a transparency of the structured layer to increase by whole-area irradiating the structured layer with UV light; and subsequently obtaining a higher transparency by tempering the structured layer after a heat treatment.

2. The process according to claim 1, which comprises carrying out the whole-area irradiation with a higher radiation dose than the structuring irradiation.

3. The process according to claim 1, which comprises using UV light for the structuring irradiation and for the whole-area irradiation.

4. The process according to claim 1, which comprises using UV light having a wavelength $\lambda > 200$ nm for the structuring irradiation and for the whole-area irradiation.

5. The process according to claim 1, which comprises using UV light for the structuring irradiation, and setting a radiation dose of 200 to 2000 $mJ/cm^2$ in the course of the structuring irradiation with UV light.

6. The process according to claim 1, which comprises using UV light having a wavelength 450 $nm \geq \lambda > 200$ nm for the structuring irradiation and for the whole-area irradiation.

* * * * *